United States Patent
Kusamitsu

[11] Patent Number: 6,124,636
[45] Date of Patent: Sep. 26, 2000

[54] MMIC PACKAGE

[75] Inventor: Hideki Kusamitsu, Tokyo, Japan

[73] Assignee: NEC Corporation, Tokyo, Japan

[21] Appl. No.: 09/237,349

[22] Filed: Jan. 26, 1999

[30] Foreign Application Priority Data

Jan. 26, 1998 [JP] Japan .................................. 10-012851

[51] Int. Cl.[7] .................................................. H01L 23/34
[52] U.S. Cl. .......................... 257/728; 257/532; 257/700; 257/703; 257/778
[58] Field of Search ........................ 257/532, 700, 257/703, 728, 778

[56] References Cited

U.S. PATENT DOCUMENTS 5,045,820  9/1991  Leicht et al. .............................. 333/26
5,521,406  5/1996  Tserng ...................................... 257/276

FOREIGN PATENT DOCUMENTS 5-145007  6/1993  Japan .

*Primary Examiner*—Olik Chaudhuri
*Assistant Examiner*—Douglas A. Wille
*Attorney, Agent, or Firm*—Sughrue, Mion, Zinn, Macpeak & Seas, PLLC

[57] ABSTRACT

Disclosed herein is an MMIC package which comprises a base substrate, a composite capacitor substrate made of a ceramics plate mounted on the base substrate, an MMIC bare chip which functions as a high frequency semiconductor element and face-down bonded on the composite capacitor substrate, and an electroconductive covering which covers, together with the base substrate, the MMIC bare chip. In order to suppress the deterioration of the electrical characteristics of the above MMIC, the above components are so arranged that the interconnection length between the components is made to be minimum.

7 Claims, 8 Drawing Sheets

MMIC PACKAGE

BACKGROUND OF THE INVENTION (a) Field of the Invention

The present invention relates to an MMIC (Monolithic Microwave IC) incorporating an MMIC bare chip which is a high frequency semiconductor element.

(b) Description of the Related Art

FIG. 1 is a sectional view showing the structure of an example of conventional MMIC packages, and FIG. 2 is a perspective view showing the peripheral structure of MMIC excluding a cap. The conventional MMIC shown in these figures has a metal header 101 made of copper or copper-tungsten, an MMIC 102 die-bonded on the header, and a small plate 103 die-bonded onto the header 101 in the vicinity of a source terminal of the MMIC. The small plate 103 is prepared by plating the both surfaces of a ceramics plate acting as a substrate having a high dielectric constant, and functions as a capacitor formed between the opposing plated surfaces. The power supply from a power source to the MMIC 102, and the input and the output of high frequency signals are performed through external terminals (pins) 104 inserted into the metal header 101. The pins 104 and the MMIC 102 are generally connected by means of bonding wires 105 made of gold or the like. A capacitor for bypassing high frequency signals is inserted between the source line of the MMIC 102 and the GND (in this case, the metal header surface acts as a GND surface) by connecting the bonding wire between the source terminal of the MMIC 102 and the surface of the capacitor 103 and further by connecting a bonding wire between the surface of the capacitor 103 and the pin 104. The whole MMIC 102 is finally covered with a cap 106, which is mounted on the metal header 101 by means of seam welding or brazing.

Since, in this construction, the bonding wire having a diameter of 20 micrometers is employed for inputting the high frequency signals to the MMIC, the externally observed electrical characteristics, especially the input and output impedances, of the MMIC bare chip unit and of the MMIC packages differ from each other due to the impedance component of the wire itself. As a result, the impedance matching is required for obtaining high input and output power efficiencies. The impedance matching is, in general, carried out by means of the capacity component of the capacitor for compensating the inductance component of the wire. In this case, its characteristics may be deteriorated during the mounting of the MMIC on the package even if the frequency range of the MMIC is designed to be broad because the frequency range capable of conducting the impedance matching is narrowed.

Based on these reasons, in order not to deteriorate the characteristics of the MMIC as much as possible, the mounting must be so performed that the inductance component of the wire is reduced to as low as possible, and in the other words, that the bonding wire length is reduced to as short as possible. Accordingly, a so-called flip chip mounting method attracts attention in which a bump, in place of the wire, is formed on an electrode on the MMIC surface which is downward directed to mount the MMIC on the substrate by the bump, because the minimum interconnect length may be realized and the electric characteristics may be best utilized.

However, several problems arise for putting the above minimum connection length technique employing the bump to the practical use.

A first problem is that a bypass capacitor which depresses the impedance of the source line to a low level cannot be located just beneath the source terminal of the MMIC. Accordingly, the bypass capacitor is not mounted near the MMIC, which causes a high inductance component is generated between the bypass capacitor and the source terminal of the MMIC. Since this inductance component functions as an element for blocking a high frequency, it may disable to depress the impedance of the source line to a low level.

Since the interconnect length between the bare chip electrode and the wiring pad on the substrate is short in the flip chip mounting method, the stresses due to the difference between thermal expansion coefficients of materials and to shocks cannot be absorbed, which causes the MMIC to be brittle. Accordingly, the electric connection between the substrate and the bare chip is generally reinforced by filling the gap between the bare chip and the substrate with epoxy based sealing resin, so that the stress on the bump connecting portion is lessened to secure the reliability of the connecting portion. Since, in the case of the MMIC, the bare chip is designed for use in air having a specific inductive capacity of 1, the electrical characteristics may be altered due to the change of designed values if such a dielectric substance as epoxy resin is present around the bare chip. When the flip chip mounting method is applied as it is to an ordinarily designed bare chip, the resin sealing may not be performed depending on circumstances. This tendency appears more remarkably with the increase of a frequency employed.

In most cases, the ordinary MMIC is so designed that its circuit possesses a micro strip structure. Since, in this case, the rear surface of the bare chip is a GND surface, the GND surface becomes the top surface after the flip-chip mounting. As a result, the connection with the GND surface formed on the substrate mounting the bare chip becomes difficult. If the potential of the GND surface of the bare chip cannot be maintained the same as that of the GND surface of the mounting substrate, the electrical characteristics may be subject to adverse effects such as unnecessary resonance.

SUMMARY OF THE INVENTION

It is therefore an object of the present invention to provide an MMIC package having means for securing a required reliability by suppressing the change of electrical characteristics encountered during the mounting of a flip chip.

The present invention provides an MMIC package which comprises an MMIC package comprising:

a base substrate having top and bottom surfaces;

a composite capacitor substrate having front and rear surfaces mounted on said base substrate; and an MMIC bare chip having front and rear surfaces, said front surface being bonded onto said composite capacitor substrate, said top surface mounting thereon a signal terminal, a source terminal and a GND pattern, said bottom surface mounting thereon a plurality of external terminals, each connected via through-holes to said signal terminal, said source terminal and said GND pattern, said front surface of the MMIC bare chip mounting thereon a signal terminal and a source terminal, said whole rear surface of the MMIC bare chip mounting thereon a GND pattern, said front surface of said composite capacitor substrate mounting thereon a planar metal pattern connected through a bump with said source terminal of the front surface of said MMIC bare chip, and a metal pad connected through a bump with said signal terminal on the front surface of said MMIC bare chip, said rear surface of said composite capacitor substrate mounting thereon a planar metal pattern opposing to said planar metal pattern of the front surface of said composite capacitor substrate and connected with said GND pattern on the top surface of said base substrate, a metal pad for a signal connected via a through-hole with said metal pad on the front surface of said composite capacitor substrate and further connected with said signal terminal of the top surface of said base substrate, and a metal pad for a power source connected via a through-hole with said planar metal pattern on the front surface of said composite capacitor substrate and further connected with said source terminal of the top surface of said base substrate.

In accordance with the MMIC package of the present invention, the connection length between an electrode on the front surface of the MMIC bare chip and an external terminal of the package can be reduced so that the deterioration of the electrical characteristics due to the influence of unwanted inductance can be made minimum.

PROFFERED EMBODIMENTS OF THE INVENTION

Figure 1:
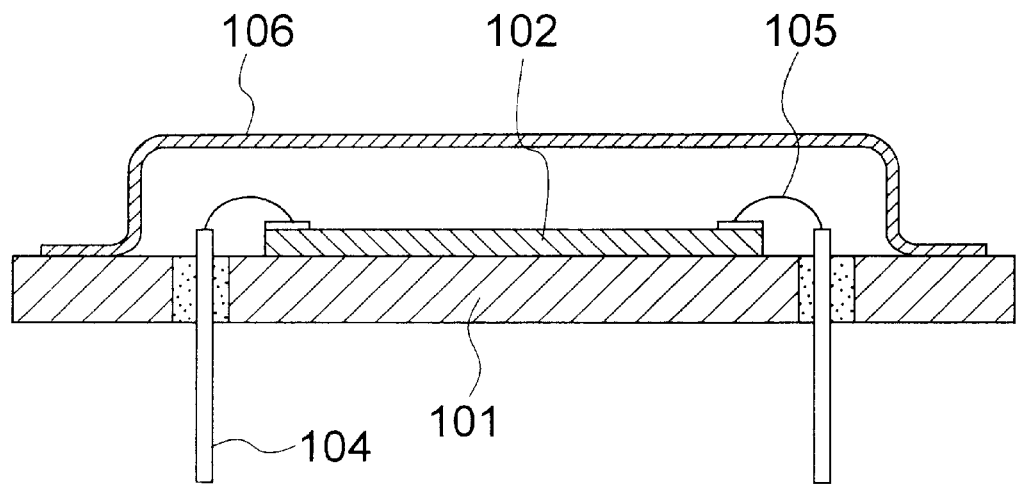
FIG. 1 is a sectional view showing one example of conventional MMIC package structures.
Figure 2:
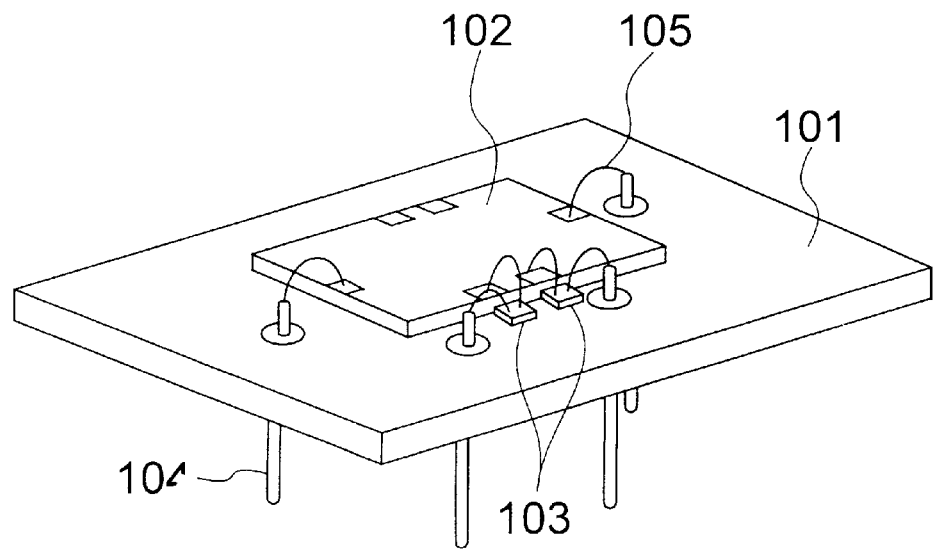
FIG. 2 is a perspective view showing the periphery structure of the MMIC shown in FIG. 1 excluding a cap.

The above mentioned construction, the composite capacitor substrate forms a capacity between the planar metal patterns on the front and rear surfaces opposing to each other.

The planar metal pattern on the front surface of the ceramics plate constituting the composite capacitor substrate is located just beneath the source terminal of the MMIC bare chip, and the planar metal pattern formed on the rear surface of the above ceramics plate opposing to the planar metal pattern on the front surface is connected with the GND terminal on the top surface of the base substrate. As a result, a bypass capacitor is made to be inserted between the source terminal of the MMIC bare chip and the GND terminal of the MMIC package. Accordingly, the influence due to the impedance of the source line to the electrical characteristics can be reduced minimum.

The present invention provides, in addition to the above MMIC package structure, another MMIC package, wherein the GND pattern on the rear surface of the MMIC bare chip and the inner side surface of the covering, and the periphery of the covering and the GND pattern of the top surface of the base substrate are separately bonded by means of an electroconductive adhesive. According to this package structure, the GND of the rear surface of the MMIC bare chip and the GND of the base substrate possess the same potential even when the flip-chip mounting is employed so that the unnecessary electrical resonance in the package can be averted.

When the electoconductive adhesive is made of material having a thermal conductivity of 35 W/mK or more, and the covering is made of SiC sintered material, the radiation efficiency to the outside of the MMIC package can be elevated.

When the covering is a mold of plastics of which a surface is treated with a metal, the weight of the covering is lighter than that of a covering made of a metal only.

In case that the base substrate is a glass ceramics substrate, the difference between the thermal expansion rates of the above glass ceramics substrate and of an ordinarily employed glass epoxy substrate mounted on the MMIC package is made to be small so as to reduce the connection problems due to thermal stress.

In the MMIC package of the present invention as mentioned above, the signal terminal and the source terminal on the front surface of the MMIC bare chip are connected with the metal pad and the planar metal pattern on the front surface of the composite capacitor substrate, and these metal pad and the planar metal pattern are connected with the metal pad for the signal and the metal pad for the electrode on the front surface of the composite capacitor substrate via through holes, and further these metal pad for the signal and the metal pad for the electrode are connected with the external terminals of the package via though holes perforated through the base substrate. Accordingly, the connecting length from the electrode on the front surface of the MMIC bare chip to the external terminal of the package is shorter than that of a conventional MMIC package employing a wire bonding method so that the deterioration of the electrical characteristics, especially of the operation band width, due to the influence of unwanted inductance is small.

Since, in addition to the realization of the minimum connection, the bypass capacitor is located just beneath the source terminal of the MMIC bare chip, the impedance of the source line can be depressed to a low value over a high band so as to depress the influence to the electrical characteristics due to the impedance of the source line minimum.

Since the structure in which the rear surface of the MMIC bare chip is bonded to the electroconductive covering is formed, the reliability with relation to the bump connection against mechanical shocks can be secured even when no underfill material required for the flip chip mounting is employed because no load is applied on the bump.

The deterioration of the electrical characteristics of the MMIC is small because the underfill material is not necessary.

Since the potential of the GND pattern on the rear surface of the MMIC is made to be the same as that of the GND of the package through the electroconductive covering, the unnecessary electrical resonance in the package can be prevented so as to obtain the stable electrical characteristics (frequency characteristic).

The more compact and thinner package is obtained compared with a conventional one.

Now, the present invention will be more specifically described with reference to the accompanying drawings.

Embodiment 1

Figure 3:
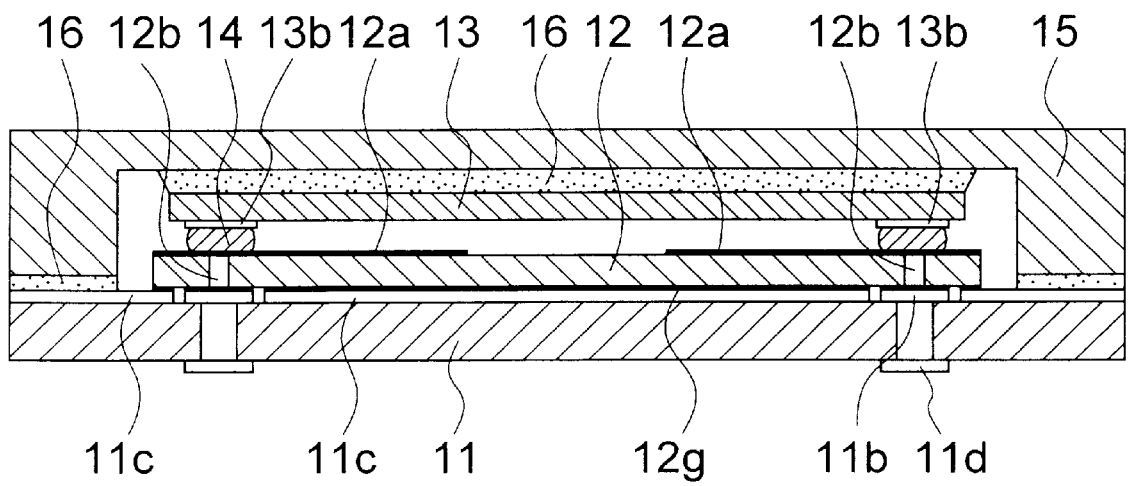
FIG. 3 is a sectional view showing an MMIC package structure according to one embodiment of the present invention.

An MMIC package according to the first embodiment shown in FIG. 3 includes base substrate 11 made of ceramics material such as alumina. A signal terminal (not shown) and a source terminal 11b are formed on the top surface of the base substrate 11, and all the surface other than these elements is covered with a planar metal pattern 11c which functions as a GND terminal.

A plurality of pads 11d for connecting with another circuit substrate exist on the bottom surface of the base substrate 11. The respective pads 11d are connected with the above signal terminal (not shown), the source terminal 11b and the planar metal pattern 11c functioning as a GND terminal via through holes. As such, the MMIC package of the present Embodiment takes a so-called LCC (leadless chip carrier) structure.

On the base substrate 11 is mounted a composite capacitor substrate 12 and an MMIC is formed on this composite capacitor substrate 12 by means of the flip chip mounting, that is, by means of face-down bonding. A gold-gold solid phase diffusion bonding method using thermal contact bonding is generally employed as a method for mounting the MMIC 13. A gold bump 14 for electrically connecting the composite capacitor substrate 12 and the MMIC 13 is formed on the pad of the MMIC 13 side or of the composite capacitor substrate 12 side employing a similar method to a wire bonding.

Figure 4:
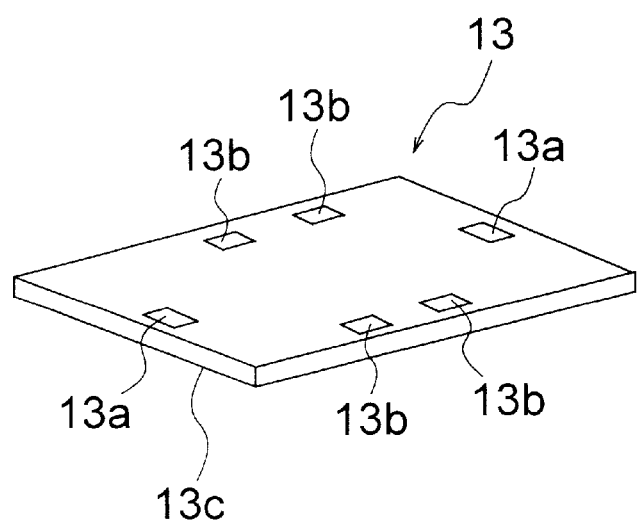
FIG. 4 is a perspective view illustrating one component of the MMIC shown in FIG. 3.

FIG. 4 is a perspective view showing the structure of the MMIC. The MMIC of this embodiment is an ordinary MMIC which has a plurality of signal terminals 13a and a plurality of source terminals 13b on the periphery of the device surface, and a GND plane on the whole bottom surface. While, in FIG. 4, the two signal terminals 13a and the four source terminals 13b are illustrated, these numbers are examples and the numbers of the terminals are limited thereto.

Figure 5:
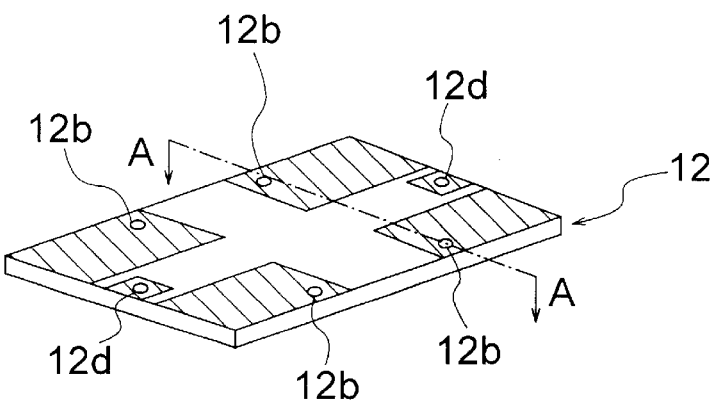
FIG. 5A is a perspective view of the composite capacitor substrate.
FIG. 5B is a plan view of the bare chip mounting side of the composite capacitor substrate.
FIG. 5C is a plan view of the base substrate side of the composite capacitor substrate.
Figure 5:
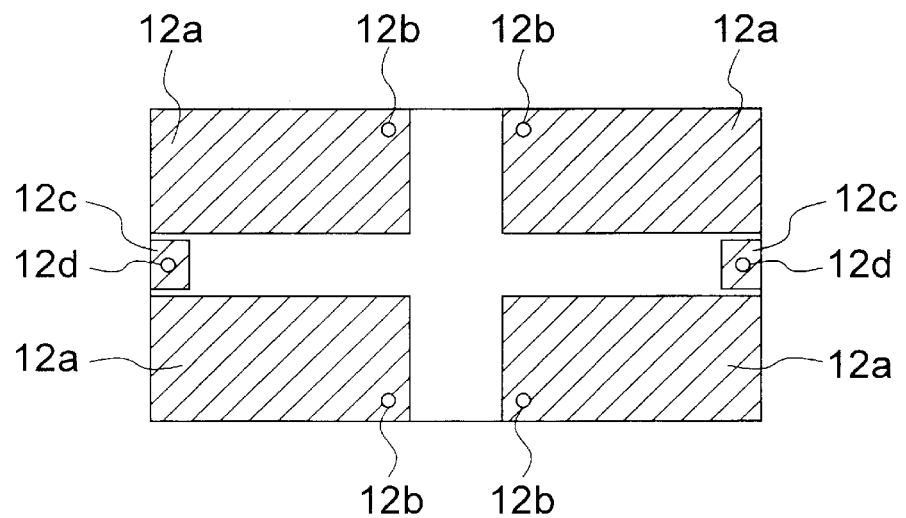
Figure 5:
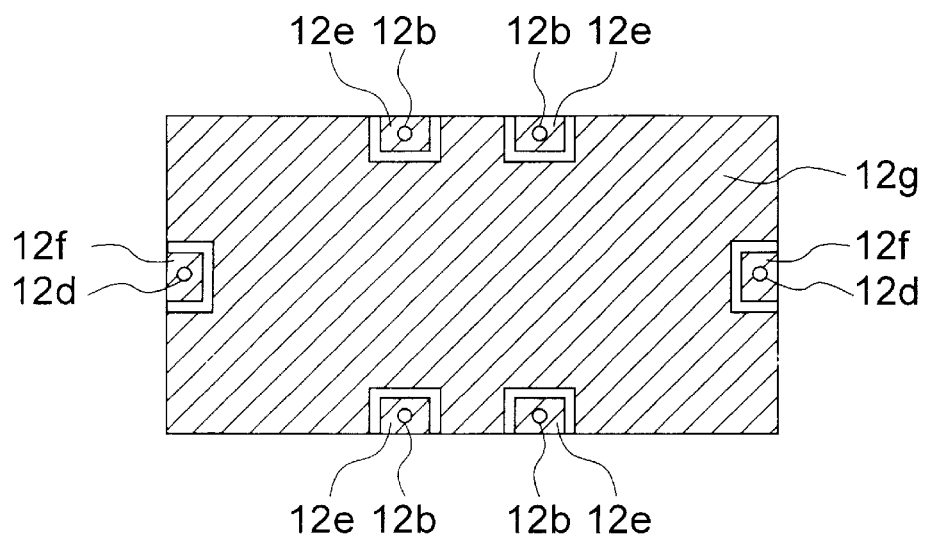
Figure 6:
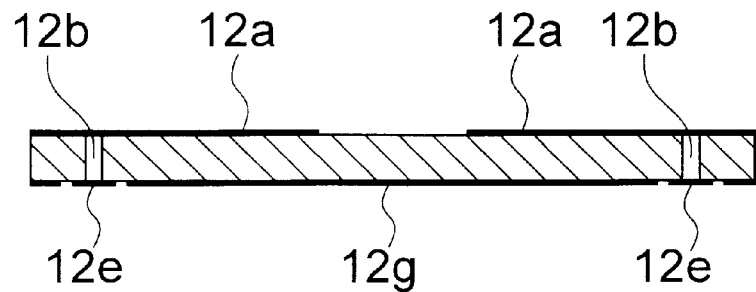
FIG. 6 is a sectional view of the composite capacitor substrate taken along a line A—A in FIG. 5A.

The composite capacitor substrate 12 is prepared by making patterns shown in FIG. 5 on the front surface and the rear surfaces of the flat substrate made of ceramics material having a high specific inductive capacity (generally 20 or more) followed by forming desired capacitance among these patterns. On the substrate surface on which the MMIC 13 is face-bonded are formed the four planar metal patterns 12a each of which is individually connected with each of the four source terminals 13b (refer to FIG. 4) and the two metal pads 12c each of which is individually connected with each of the two signal terminals 13 of the MMIC (refer to FIG. 4) as shown in FIG. 5(b). In FIGS. 5A and 5B, metal patterns on the substrate is designed by hatching.

On the other hand, on the other substrate surface which is in contact with the base substrate 11 after the mounting are formed metal pads 12e connected with the planar metal patterns 12a through current extraction through holes 12b and metal pads 12f connected with the metal pads 12c through the signal extraction through holes 12d. The planar metal patterns 12g is formed on the whole surface other than the through holes 12b, 12c. The through holes 12b, 12d are easily obtained by employing a razor processing method.

Figure 7:
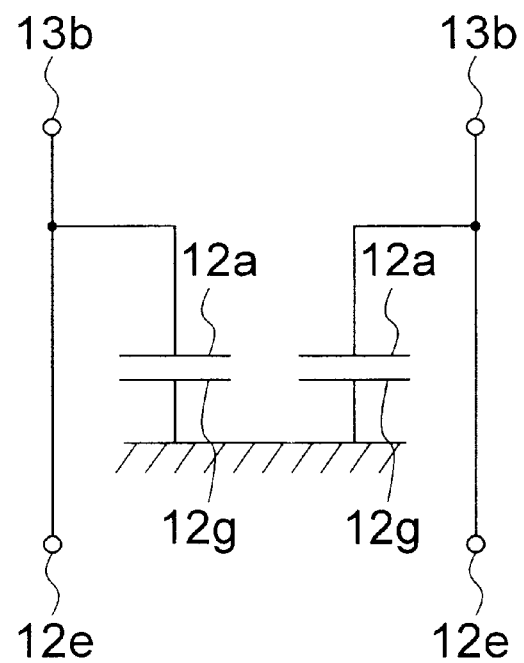
FIG. 7 shows a circuit obtained by connecting the composite capacitor substrate shown in FIG. 5 with the base substrate and the MMIC.

FIG, 6 is a sectional view of the substrate of which patterns are thus formed taken along the line A—A passing through the current extraction through hole 12b as shown in FIG. 5(a). The respective planar metal patterns 12a oppose to the respective planar metal patterns 12g through the ceramics substrate as shown in this drawing so that a capacitor is produced between the planar metal patterns 12a and 12g. The respective metal patterns 12a are electrically connected with the source terminals 13b of the MMIC 13, and are further electrically connected with source terminal 11b of the base substrate 11 through the source extracting through-holes 12b and the metal pads 12e. On the other hand, the planar metal pattern 12g is connected with the planar metal pattern 11c functioning as the GND terminal of the base substrate 11. The said connection structure provides a circuit having a capacitor inserted between the source line and the GND as shown in FIG. 7.

An electroconductive covering 15 is equipped on the rear surface of the MMIC 13 mounted on the composite capacitor substrate 12 as described, and the covering 15 seals, together with the base substrate 11, the composite capacitor substrate 12 and the MMIC 13 on the base substrate 11. The covering 15 is desirably made of a metal in order to integrate the GND terminal 13c formed on the rear surface of the MMIC 13 and the planar metal pattern 11c functioning as the GND terminal formed on the base substrate 11. The covering 15 may be equipped with a radiation fin. The bonding between the rear surface of the MMIC 13 and the inner portion of the covering 15, and the bonding between the covering 15 and the base substrate 11 may be performed by employing electroconductive epoxy resin functioning as an electroconductive adhesive capable of being cured at a temperature as low as 150° C. (for example, POLYSOLDER available from Technoalpha Corporation).

Then, the components of the MMIC package of this Embodiment will be described along an assembly process referring to FIGS. 8 to 11.

Figure 8:
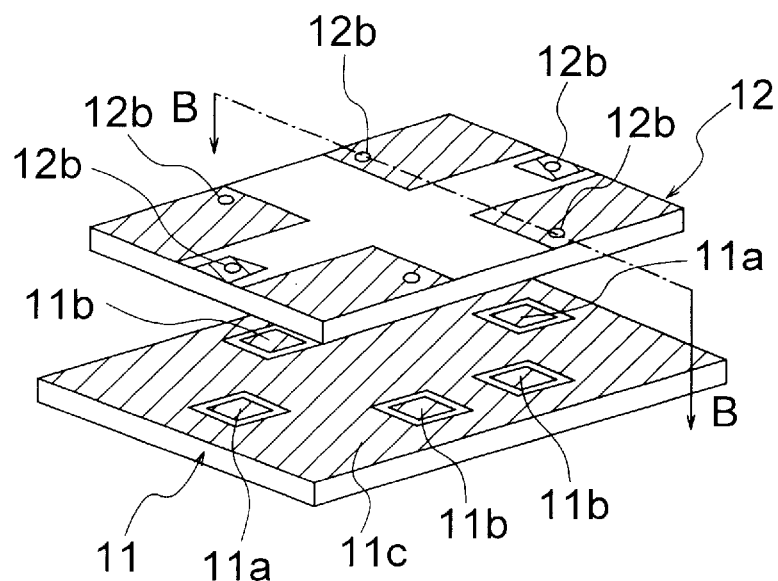
FIG. 8A is a perspective view describing part of a fabrication process.
FIG. 8B is a sectional view taken along a line B—B of FIG. 8A.
Figure 8:
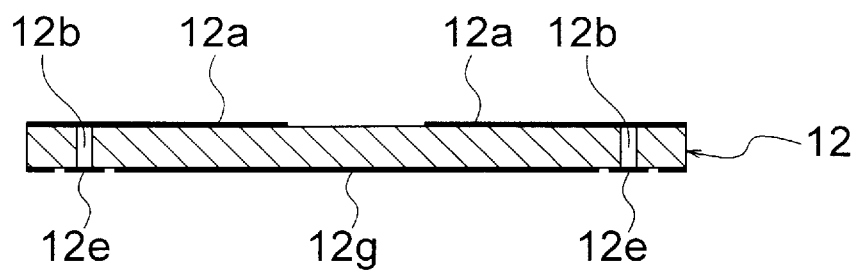
Figure 8:
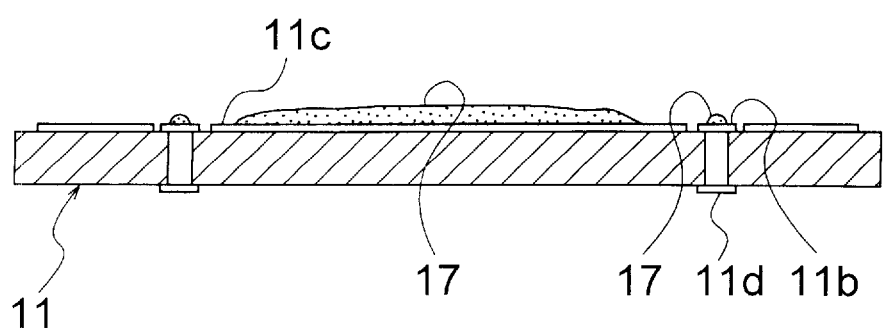

At first, the composite capacitor substrate 12 is mounted on the base substrate 11 as shown in FIG. 8. At this instance, the metal pad 12e on the rear surface of the composite capacitor substance 12 is electrically connected with source terminal 11b of the top surface of the base substrate 11, and the metal pad 12f (refer to FIG. 5C) on the rear surface of the composite capacitor substrate 12 is electrically connected with the signal terminal of the top surface of the base substrate 11. The planar metal pattern 12g on the rear surface of the composite capacitor substrate 12 is electrically connected with the planar metal pattern 11c functioning as the GND terminal on the top surface of the base substrate 11. For the bonding of the composite capacitor substrate 12, wax-like material having a melting point of 300° C. or more such as a gold-silicon based material is employed considering the thermal career during the flip chip thermal contact bonding process.

Figure 9:
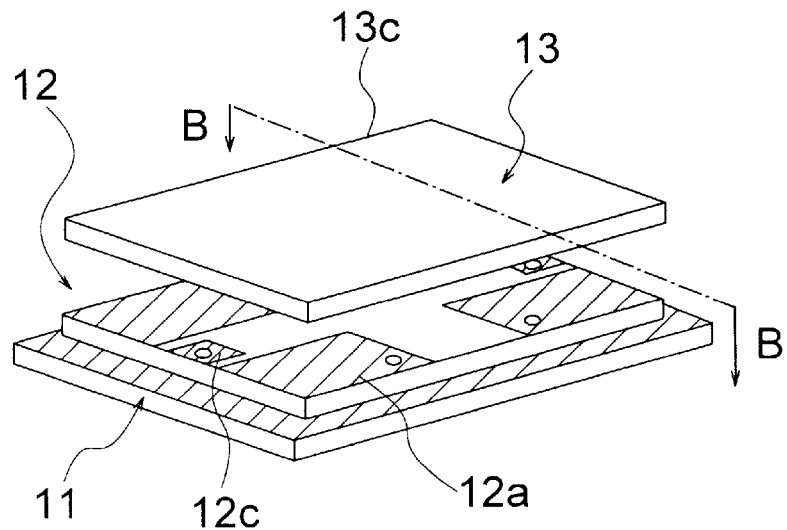
FIG. 9A is a perspective view describing part of a fabrication process.
FIG. 9B is a sectional view taken along a line B—B of FIG. 9A.
Figure 9:
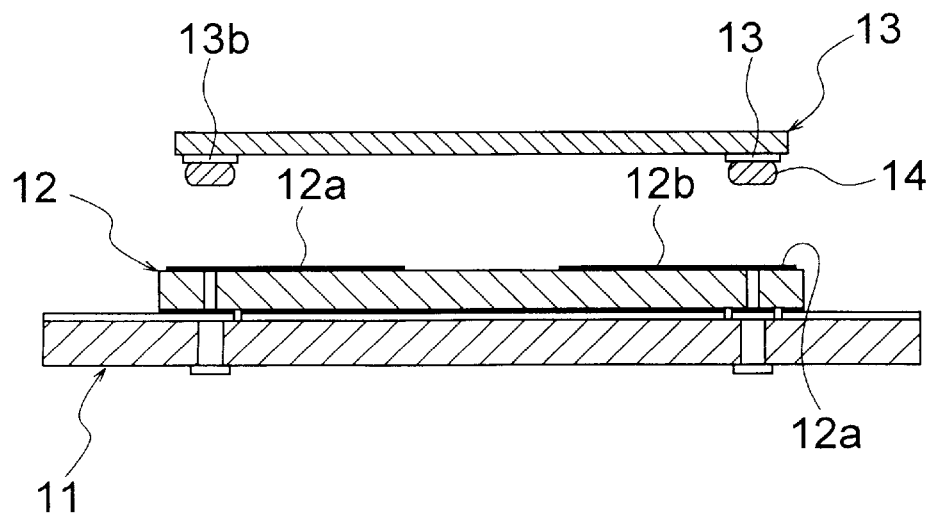

Then, the MMIC 13 is mounted on the composite capacitor substrate 12 employing the flip chip mounting method as shown in FIG. 9. At this instance, the source terminal 13b on the front surface of the MMIC 13 is, while turning the front surface of the MMIC 13 downward, electrically connected with the planar metal pattern 12a on the front surface of the composite capacitor substrate 12, and the signal terminal (refer to the numeral 13a of FIG. 4) of the MMIC 13 is electrically connected with the metal pad 12c on the front surface of the composite capacitor substrate 12. A gold-gold thermal contact bonding method is employed as the flip chip mounting method. In this case, a pressure applied is desirably about 100 g per one bump, and a temperature is 300° C. or less.

Figure 10:
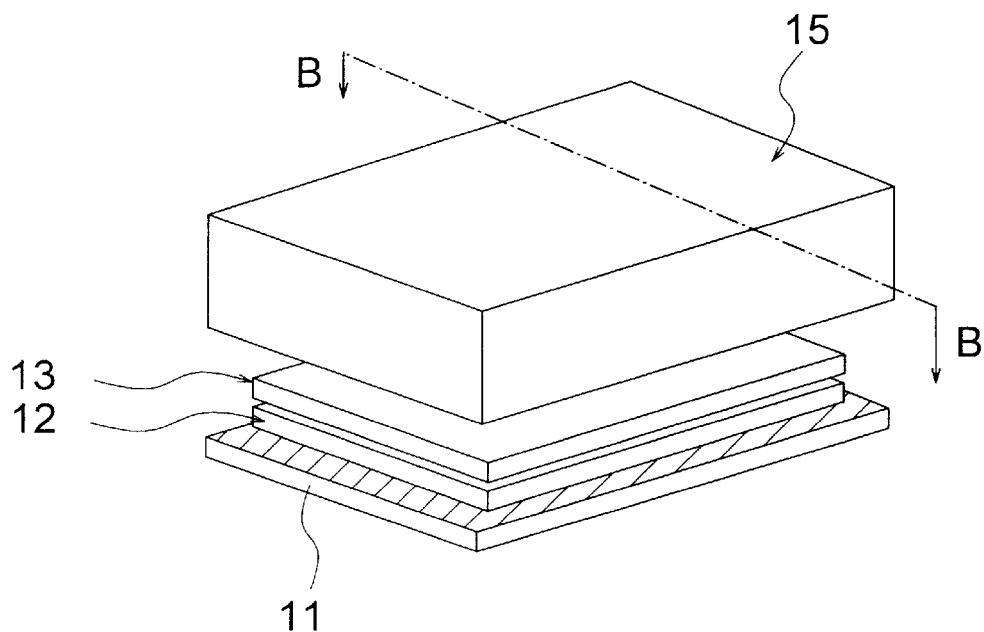
FIG. 10A is a perspective view describing part of a fabrication process.
FIG. 10B is a sectional view taken along a line B—B of FIG. 10A.
Figure 10:
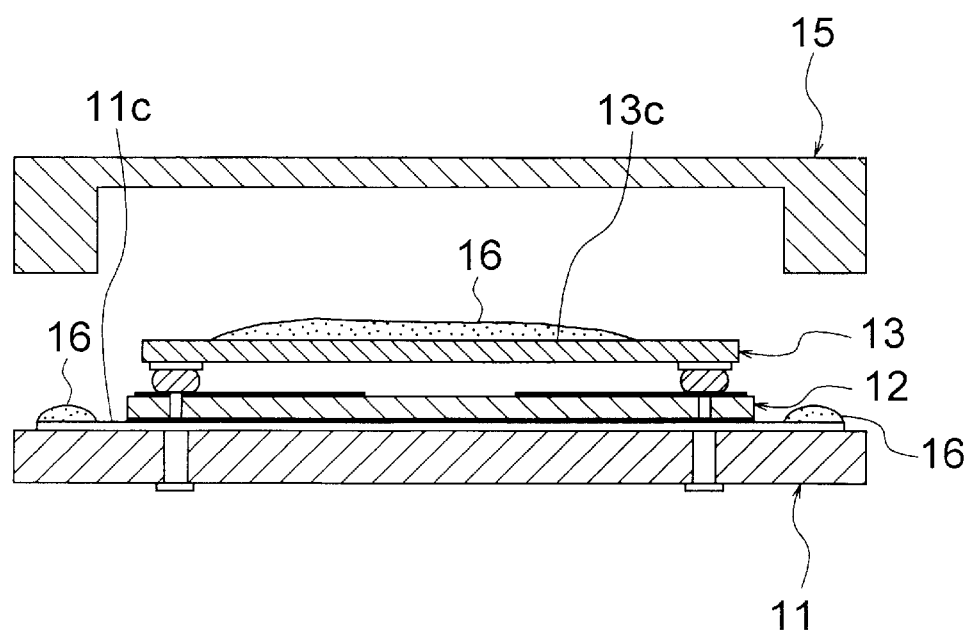

Finally, the metal covering 15 is so installed above the base substrate 11 that the MMIC 13 is covered by the covering 15 as shown in FIG. 10. At this instance, the covering 15 is fixed to the rear surface of the MMIC 13 and to the periphery surface of the base substrate 11 by applying electroconductive epoxy resin material or eutectic solder which is an electroconductive adhesive to the rear surface of the MMIC 13 and to the periphery surface of the base substrate 11. When POLYSOLDER available from Technoalpha Corporation is employed, the curing may be conducted at a temperature of 150° C. for five minutes. The MMIC 13 is sealed by the mounting of the covering, and the GND surface 13c of the MMIC 13 is electrically connected with the planar metal pattern 11c functioning as the GND terminal on the base substrate 11 through the metal covering 15.

Figure 11:
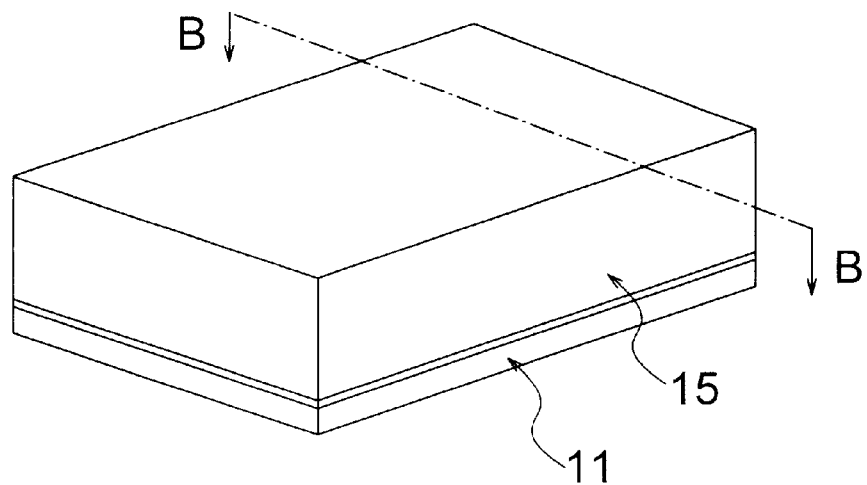
FIG. 11A is a perspective view describing part of a fabrication process.
FIG. 11B is a sectional view taken along a line B—B of FIG. 11A.
Figure 11:
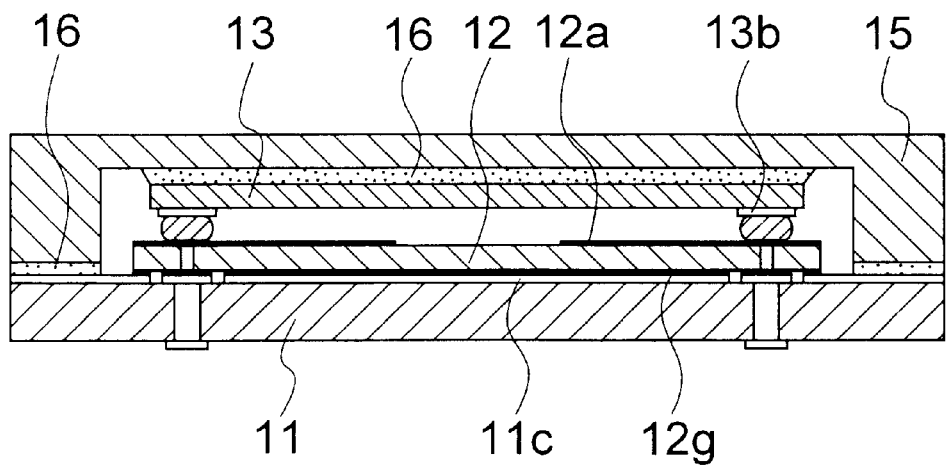

According to the above assembly process, the MMIC package shown in FIG. 11 is completed.

In accordance with such an Embodiment, the planar metal pattern 12a on the front surface of the ceramics plate constituting the composite capacitor substrate 12 is located just beneath the source terminal 13b of the MMIC 13, and the planar metal pattern 12g formed on the rear surface of the above ceramics plate opposing to the planar metal pattern 12a is connected with the planar metal pattern 11c functioning as the GND terminal of the base substrate 11c. As a result, a bypass capacitor is realized and inserted between the source terminal 13b of the MMIC 13 and the GND terminal of the MMIC package. Since the rear surface of the MMIC chip is usually a GND surface, the potentials of the GND of the MMIC rear surface and of the GND of the base substrate can be maintained at the same level by means of bonding the MMIC 13 rear surface to the metal covering 15 employing the electroconductive resin 16 and of bonding the periphery of the covering to the planar metal pattern 11c functioning as the GND terminal on the top surface of the base substrate employing the electroconductive resin 16.

The following material may be preferably selected as the components of the MMIC package of the Embodiment described above.

In case of incorporating a high radiation bare chip into the present package, material having high thermal conductivity such as DM603Hk available from Dymat Corporation (thermal conductivity is 50 W/mK while that of the eutectic solder is about 35 W/mK) is employed, in place of the eutectic solder, as the electroconductive adhesive on the rear surface of the MMIC 13 for effectively conducting the radiation from the rear surface of the MMIC 13. SiC sintered material having high thermal conductivity (thermal conductivity is 180 W/mK while that of the Coval is about 3 to 6 W/mK) is employed in place of ordinarily employed Coval as material of the covering 15, thereby enabling to elevate the efficiency of the radiation to outside of the package.

The weight of the package can be reduced by employing a covering made of plastics of which a surface is treated with a metal compared with employing a covering made of a metal only.

In case of connecting the present package onto an ordinarily employed glass epoxy based printed-wiring board through solder, a connection problem may be generated in relation with fatigue destruction at the solder connection portion by means of thermal stress produced due to the difference of the thermal expansion rates between the above printed-wiring board and the base substrate 11 of the package. In order to prevent this disadvantage, it may be possible to minimize the difference of the thermal expansion rates of a mother board (in case of a glass epoxy substrate, the thermal expansion rate is 14 ppm/° C.) and the package base substrate to reduce the thermal stress applied to the solder connection portion so as to elevate the connection life, by employing a glass ceramics substrate having a high thermal expansion rate (thermal expansion rate is 11 ppm/° C. while that of the alumina substrate is about 6 to 8 ppm/° C.).

Since the above embodiments are described only for examples, the present invention is not limited to the above embodiments, and various modifications or alternations can be easily made therefrom by those skilled in the art without departing from the scope of the present invention.

What is claimed is:

1. An MMIC package comprising:

a base substrate having top and bottom surfaces;

a composite capacitor substrate having front and rear surfaces mounted on said base substrate; and an MMIC bare chip having front and rear surfaces, said front surface being bonded onto said composite capacitor substrate,
said top surface mounting thereon a signal terminal, a source terminal and a GND pattern,
said bottom surface mounting thereon a plurality of external terminals, each connected via through-holes to said signal terminal, said source terminal and said GND pattern,
said front surface of the MMIC bare chip mounting thereon a signal terminal and a source terminal,
said whole rear surface of the MMIC bare chip mounting thereon a GND pattern,
said front surface of said composite capacitor substrate mounting thereon a planar metal pattern connected through a bump with said source terminal of the front surface of said MMIC bare chip, and a metal pad connected through a bump with said signal terminal on the front surface of said MMIC bare chip,
said rear surface of said composite capacitor substrate mounting thereon a planar metal pattern opposing to said planar metal pattern of the front surface of said composite capacitor substrate and connected with said GND pattern on the top surface of said base substrate, a metal pad for a signal connected via a through-hole with said metal pad on the front surface of said composite capacitor substrate and further connected with said signal terminal of the top surface of said base substrate, and a metal pad for a power source connected via a through-hole with said planar metal pattern on the front surface of said composite capacitor substrate and further connected with said source terminal of the top surface of said base substrate.

2. The MMIC package as defined in claim 1, wherein the MMIC package has an electroconductive covering covering, together with said base substrate, said MMIC bare chip.

3. The MMIC package as defined in claim 1, wherein said composite capacitor substrate forms a capacity between said planar metal patterns on the front and rear surfaces of said composite capacitor substrate opposing to each other.

4. The MMIC package as defined in claim 2, wherein said GND pattern on the rear surface of said MMIC bare chip and the inner side surface of said covering, and the periphery of said covering and said GND pattern of the top surface of said base substrate are bonded by means of an electroconductive adhesive.

5. The MMIC package as defined in claim 3, wherein said electroconductive adhesive is made of material having a thermal conductivity of 35 W/mK or more, and said covering is made of SiC sintered material.

6. The MMIC package as defined in claim 3, wherein said covering is a mold of plastics of which a surface is treated with a metal.

7. The MMIC package as defined in claim 3, wherein said base substrate is a glass ceramics substrate.

* * * * *